June 10, 1969 A. G. NASSIBIAN 3,449,644
SEMICONDUCTOR DEVICE WITH INVERSION LAYER, UNDERNEATH AN OXIDE COATING, COMPENSATED BY GOLD DOPANT
Filed Dec. 13, 1965 Sheet 1 of 3

INVENTOR.
ARMENAG G. NASSIBIAN
BY
Frank R. Trifari
AGENT

INVENTOR.
ARMENAG G. NASSIBIAN
BY
Frank R. Trifari
AGENT

INVENTOR.
ARMENAG G. NASSIBIAN
BY
AGENT

United States Patent Office 3,449,644

Patented June 10, 1969

3,449,644

SEMICONDUCTOR DEVICE WITH INVERSION LAYER, UNDERNEATH AN OXIDE COATING, COMPENSATED BY GOLD DOPANT

Armenag Garabed Nassibian, Harrow, England, assignor, by mesne assignments, to U.S. Philips Corporation, New York, N.Y., a corporation of Delaware Filed Dec. 13, 1965, Ser. No. 513,511
Claims priority, application Great Britain, Dec. 16, 1964, 51,202/64
Int. Cl. H01l *11/00, 15/00*
U.S. Cl. 317—235 6 Claims

ABSTRACT OF THE DISCLOSURE

A semiconductor device of the unipolar or bipolar types employing silicon containing an oxygen-rich region, in which the effects of the oxygen are at least partly compensated by introducing gold into the oxygen-rich region. Among the improvements obtained are a reduction in channelling and better control of deliberately induced inversion layers.

The invention relates to semiconductor devices comprising a monocrystalline silicon body.

In silicon devices technology a frequently used process step is the formation of an oxide layer on the surface of a monocrystalline silicon substrate. It is known that such oxide layers affect the electrical properties of the silicon layer immediately below the oxide layer. One effect which can be observed is an apparent increase in the density of donors at the surface of the silicon substrate. This apparent increase may be due to the formation of $SiO_4^+$ complexes in the substrate formed by the diffusion of oxygen into the substrate when heated at temperatures below 500° C. The behaviour of oxygen in silicon has been reported by Kaiser et al. in Physical Review, vol. 105 (1957), at page 1751; and vol. 112 (1958), at page 1546. Another effect which can be observed is the increase in donor surface state density. These states exist at the silicon-silicon dioxide interface and are available to be filled by an electron, whence they become neutralized.

These effects may be sufficient to cause a p-type silicon substrate to exhibit a thin n-type layer beneath the oxide layer. This n-type layer is referred to as an inversion layer and a layer having a higher concentration of donors formed on an n-type substrate surface by oxidation of the surface is referred to as an enhancement layer.

According to the invention a body of silicon contains a region of oxygen-rich silicon, in which the effect of oxygen is compensated at least in part by the presence of gold in the oxygen-rich region.

Oxygen-rich silicon is silicon in which oxygen can be detected by using an infra-red detector using a wavelength of 9.1$\mu$. Silicon in which oxygen cannot be detected is oxygen-free silicon and in practice it has been found that the lower limit of detection is $2\times10^{17}$ cm.$^{-3}$, the upper limit of $1.8\times10^{18}$ cm.$^{-3}$ being determined by the maximum solubility of oxygen in silicon.

The gold may be present in such concentration that the resistivity of the region is altered to a greater extent than if the region was oxygen-free. The gold concentration may be less than that which would affect the resistivity of oxygen-free silicon.

The alteration of the electrical properties of the surface layer of a silicon substrate which has been subjected to an oxidation process is a disadvantage when the oxidation process is being used to prepare devices the electrical characteristics of which are dependant on the properties of the semiconductor surface.

A further aspect of the invention is a silicon body according to the invention having a layer of silicon dioxide on one surface.

Examples of such devices dependent upon the surface characteristics are those in which two p-n junctions terminate in close proximity at a surface. The electrical properties of the surface between the terminating p-n junctions will affect the magnitude of any current flowing between the p-n junctions.

The invention also relates to semiconductor devices comprising a silicon body according to the further aspect of the invention having a p-n junction within the body, which may terminate at least in part at the surface on which the oxide layer is formed.

Examples of such devices are the double diffused so-called planar transistor, in which two diffusion steps are carried out on one surface of a silicon body, and the insulated gate field effect transistor. The semiconductor device to which the invention also relates may have a second p-n junction terminating at least in part at the surface on which the oxide layer is formed. The silicon insulated gate field effect transistor is described in an article by Hofstein and Heiman in the Proceedings of the I.E.E.E., September 1963, at page 1190.

When a silicon insulated gate field effect transistor is in use the current flow between two closely spaced ($\sim10\mu$) low resistivity diffused surface regions of one conductivity type formed in a high resistivity silicon substrate of the other conductivity type is modulated by the application of a voltage to a metal layer, the gate electrode, provided on a silicon dioxide layer provided on the surface of the silicon substrate between the two diffused regions. The terms low and high resistivity are relative and the diffused surface regions must be of sufficiently low resistivity for there to be only a small voltage drop between the ohmic contact to the region and the p-n junction between the region and the substrate. The resistivity of the substrate must be high enough to allow a current carrying channel to be induced in the surface. The transistor is referred to as an n-type device if the current flow occurs in an n-type induced channel between two n+ surface regions. With such an n-type device the presence of an inversion layer at the surface of the silicon substrate under the oxide layer will allow current to flow between the two surface regions when no voltage is applied to the gate electrode, i.e., under zero bias conditions. The current will cease to flow only when a certain negative potential applied to the gate electrode increases the concentration of holes in the inversion layer sufficiently to compensate for the excess donor centres.

The invention will now be described with reference to the accompanying diagrammatic drawings in which.

Figure 1:
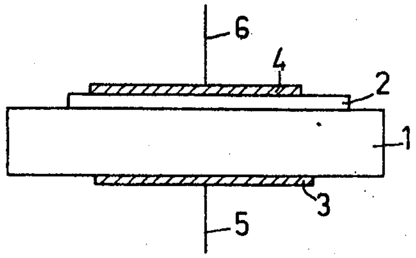
FIGURE 1 shows a vertical section of a MOS capacitance.

It has been found that the metal oxide semiconductor (MOS) capacitor device also termed a surface varactor diode and the silicon insulated gate field effect transistor are useful configurations for the study of the properties of monocrystalline silicon when containing free oxygen and gold. The MOS capacitor shown in FIGURE 1 comprises a monocrystalline body 1 of silicon having an oxide layer 2 formed on one plane surface and an ohmic contact 3 made on the opposite surface. A conductive layer 4 is applied to the oxide layer 2 and electrical connections 5, 6 allow electrical signals to be applied to the device.

Figure 4:
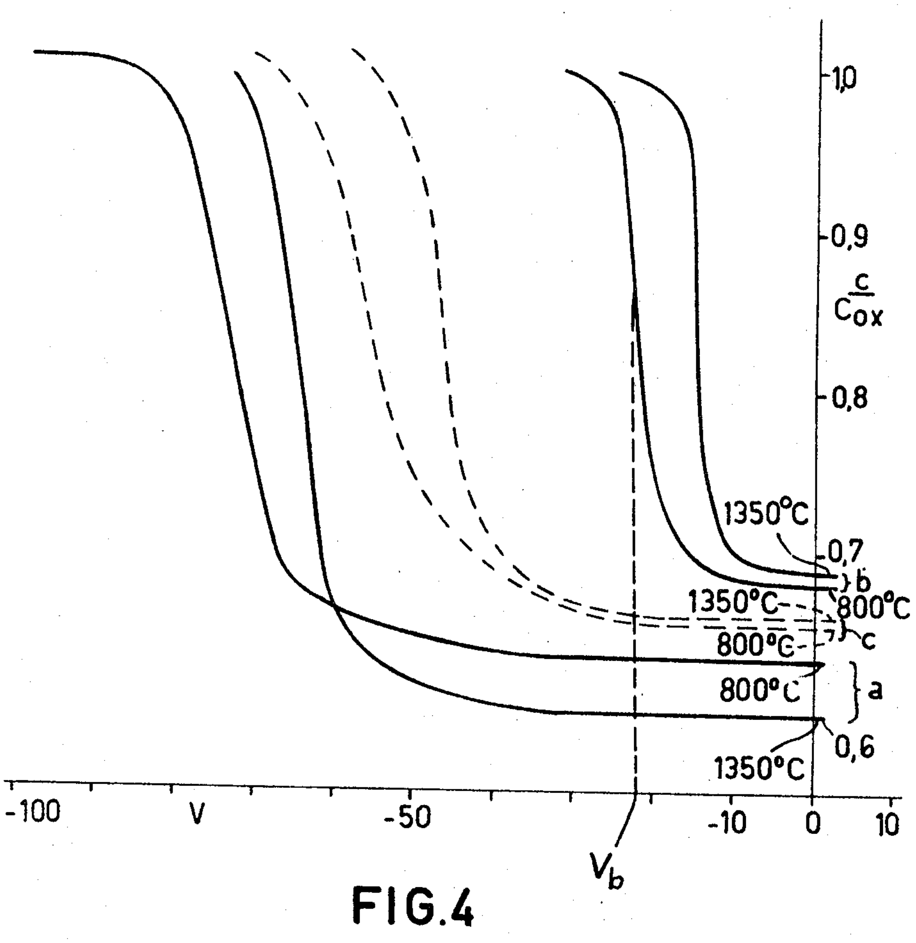
FIGURE 4 shows graphs illustrating characteristics of the device shown in FIGURE 1.
Figure 5:
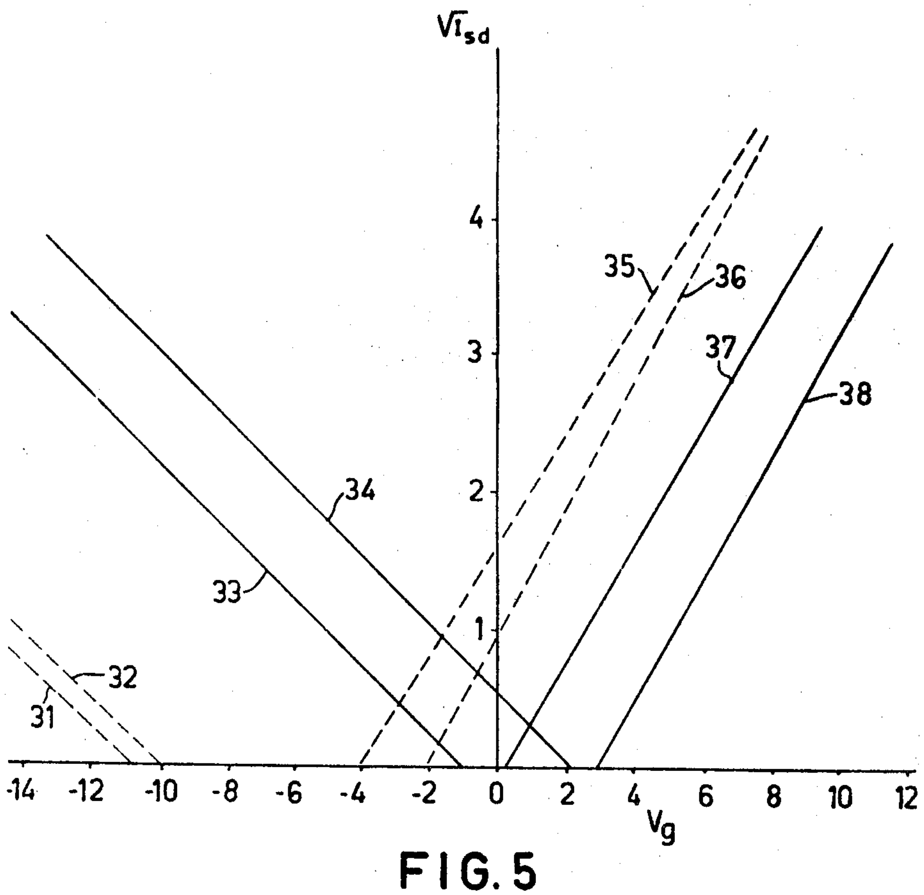
FIGURE 5 shows graphs illustrating characteristics of the device shown in FIGURE 2.

It has been shown by previous workers that the MOS capacitor device can be used to determine the density of states in the silicon body; see, for example, the article by K. Lehovec, A. Slobodsky and J. L. Sprague in Phys. Stat., vol. 3 (1963), at page 447. In FIGURE 4 there are illustrated capacitance-voltage characteristics of MOS capacitor devices which were made as follows. Monocrystalline slices of float zone refined p-type silicon with a resistivity of 6 ohm-cm. had a layer of silicon dioxide 0.4$\mu$ in depth grown on a (111) surface by known techniques. Aluminum was evaporated onto the dioxide surface to form the circular conductive layer which had a diameter of 1.5 mm. The capacitance of the device was measured as a function of the applied direct potential which had a superimposed 4 mc./s. signal. The values of the capacitance found have been normalised by dividing by the maximum capacitance ($Cox$) which was measured. It has been found that this operation eliminates any scatter in the values of $Cox$ measured for various devices. The curves are seen to be asymptotic to $C/Cox=1$.

Oxidation of these devices was carried out at 800° C. and 1350° C. in oxygen and the characteristics of devices prepared from silicon wafers oxidised at these temperatures are indicated as FIGURE 4*a*. Also devices were prepared in which gold has been introduced into the silicon slice after oxidation by evaporating a thin layer of gold onto the surface of the silicon slice not having an oxide layer and diffusing the gold into the silicon slice by heating it at 1000° C. for 30 minutes in a dry nitrogen atmosphere. It was found that the depth of gold deposited on the surface did not appear to have any effect on the result and it appears that the heat treatment to which the device is subjected is the parameter which determines the device characteristics. The gold remaining on the surface after the heat treatment may be lapped off if desired. Characteristics of these devices are shown in FIGURE 4*b*. In FIGURE 4*c* are shown the characteristics of the control devices which had been subjected to the same heat treatment as those devices into which gold had been diffused. From the theory of MOS capacitors, the capacitance-voltage characteristic can be used to determine:

(i) The carrier concentration in the bulk material using the minimum capacitance value; and (ii) The total number of surface states using the voltage at which the capacitance changes. This voltage is that at which the flat band region of the graph occurs and is the point of inflexion of the curve. The voltage $V_b$ is indicated as an example on graph 4(*b*) (800° C.) The theoretical curve lies symmetrically about the vertical axis and the displacement of the experimental curve is measured by the voltage at which the capacitance changes.

In Table I there are shown results for the bulk material obtained from the graphs in FIGURE 4. The added acceptor densities of $0.75\times10^{15}$ cm.$^{-3}$ in each case introduced by the diffusion of gold into the silicon body must be compared to the change of impurity density calculated from the change of bulk resistivity of the silicon body. With oxidations at 800° C. and 1350° C. the bulk resistivities were 15.2 and 12.7 ohm-cm. respectively after gold was diffused.

The increases in resistivity indicate that the gold acted as a donor in the bulk material which was of oxygen-free silicon (i.e., $<10^{17}$ cm.$^{-3}$) as it was float zone refined. The density of acceptor states calculated from these values are C.$9\times10^{15}$ cm.$^{-3}$ and $1.05\times10^{15}$ cm.$^{-3}$ for 800° and 1350° C. oxidation respectively. These results indicate that there may be an interaction between gold and oxygen diffused into the silicon body under the oxide layer.

In Table II is shown the effect of gold on the surface state charge density derived from the graphs shown in FIGURE 4.

TABLE I

| | 800 ° C. | 1,350° C. |
|---|---|---|
| Resistivity of silicon slice (Ω-cm.) | 5.94 | 6.12 |
| Minimum capacitance of control MOS device | 0.655 | .66 |
| Acceptor density ($\times10^{15}$) | 2.25 | [1] 2.35 |
| Gold diffused device minimum capacity | 0.683 | .688 |
| Acceptor density ($\times10^{15}$) | 3.0 | [1] 3.1 |
| Added acceptor density ($\times10^{15}$) | 0.75 | [1] 0.75 |

[1] Cm.$^{-3}$.

TABLE II

| | 800° C. | 1,350° C. |
|---|---|---|
| Donor surface charge density after oxidation ($\times10^{12}$) | 4.3 | [1] 3.76 |
| Donor surface charge density of control ($\times10^{12}$) | 3.24 | [1] 2.65 |
| Donor surface charge density with gold diffused ($\times10^{12}$) | 1.28 | [1] 0.85 |
| Added acceptor surface states (control donor surface charge density minus density after gold diffusion) | 1.96 | [1] 1.80 |

[1] Cm.$^{-2}$.

Figure 2:
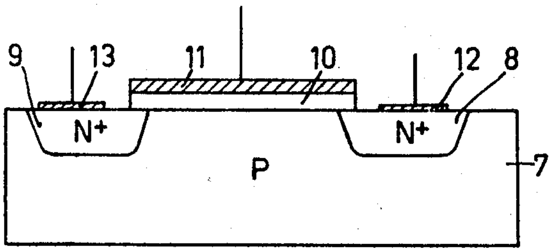
FIGURE 2 shows a vertical section of an insulated gate field effect transistor.

In FIGURE 2 there is shown a vertical section of a silicon insulated gate field effect device. Two spaced n+ surface regions 8, 9 are formed by diffusion techniques in a monocrystalline silicon body 7. A layer of silicon dioxide 10 covers the surface of the body 7 between the spaced diffused regions 8, 9. A conductive layer 11 is formed on the surface of the dioxide layer and ohmic contacts are made to the conductive layer and the two n+ surface regions. This device is a majority carrier device; thus in the n-type induced channel electrons are the current carriers, while in a collector/base/emitter transistor the minority carriers in the base carry the current.

Two samples of an n-type IGFET device and two samples of a p-type IGFET device were prepared using known diffusion techniques and the characteristics of drain current (plotted as $\sqrt{I_{sd}}$) and gate voltage were determined. These charactertistics indicate the gate voltage of the device at which the drain current becomes zero, this value of the gate voltage is termed the cut-off voltage. After the characteristics had been determined using a probe technique, gold was diffused into the silicon bodies by evaporating 1 cm. of 0.5 mm. diameter gold wire onto the surface of the silicon body and then heating for 10 minutes at 1000° C. in a nitrogen atmosphere. The p-type device having the characteristic (curve) 31 gave the characteristic (curve) 33 after gold diffusion. The characteristic 31 indicates a cut-off voltage of −11 volts which indicates the presence of an n-type accumulation layer on the surface of the n-type substrate under the oxide layer. The gold diffusion step increases the concentration of acceptor centres and the concentration of excess donor centres in the accumulation layer is reduced; the device now has a cut-off voltage of −1 volt. Similarly the p-type device having the characteristic (curve) 32 before gold diffusion has the characteristic (curve) 34 after the gold diffusion step. In this device the cut-off voltage is seen to be 2 volts, which indicates the presence of a p-type inversion layer under the oxide layer; the concentration of excess acceptor centres being compensated by induced donor centres.

The n-type devices having the characteristics (curves) 35, 36 before gold diffusion have the characteristics (curves) 37, 38 respectively after the gold diffusion step. These devices are given positive cut-off voltages by the gold diffusion, whereas before the gold diffusion the devices had negative cut-off voltages because of the presence of an n-type inversion layer on the substrate surface.

Thus the invention extends to a semiconductor device in which the p-n junctions are formed between two spaced low resistivity surface regions and a high resistivity silicon substrate in which the spaced surface regions are formed with an insulating layer consisting of at least partly of silicon dioxide on the substrate surface between the spaced surface regions, a conductive layer on the insulating layer and ohmic connections to the spaced surface regions and the conductive layer and having gold introduced into at least the substrate adjacent to the insulating layer.

The insulating layer may contain oxides other than silicon oxide, for example lead oxides and titanium dioxide.

Figure 3:
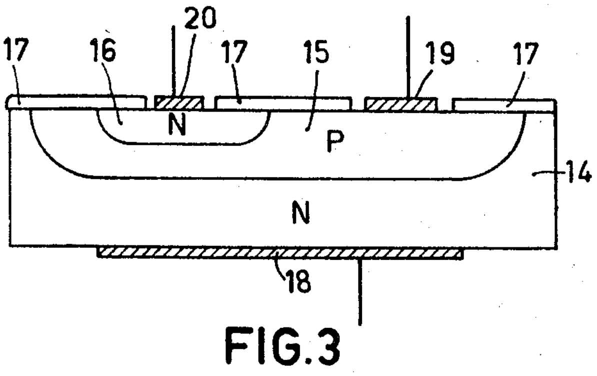
FIGURE 3 shows a vertical section of a double diffused planar transistor.

In the formation of an npn transistor illustrated in FIGURE 3, a silicon n-type monocrystalline substrate 14 has successive diffusion steps carried out on one surface in which dopant materials are diffused into the substrate through so-called windows etched in an oxide layer on the surface. A p-type dopant is first diffused into an area of the substrate to form the region 15 and then an n-type dopant is diffused into an area within the p-type diffused area to form the region 16. Ohmic contacts 18, 19, 20 are then applied to the regions 14, 15, 16 respectively for the application of electrical signals to the device. The oxide layer 17 which covers the terminations of the p-n junctions at the surface may be retained after the diffusion steps.

The oxide layer 17 covers the surface of the region 15 except where the ohmic contact 19 has been provided. The presence of this oxide layer may increase the concentration of donors at the surface of this region and thus the breakdown characteristics of the device may be affected. The introduction of gold into the silicon body increases the concentration of acceptors under the oxide layer and the breakdown characteristics of the device are then dependant to a greater extent on the bulk properties of the silicon.

The invention also extends to a semiconductor device in which the p-n junctions terminate at the surface and define emitter, base and collector regions of a transistor.

In order to compare the characteristics of silicon bodies which are oxygen-rich with bodies which are oxygen-free, experiments were carried out in which gold was diffused into oxygen-free silicon bodies and oxygen-rich silicon bodies having no oxide layer formed on a surface.

A convenient method of introducing gold into silicon bodies is that in which gold is diffused into a silicon body floating on a molten alloy of gold and silicon saturated with silicon. A silicon disc having a diameter of 3 cm. and a thickness of 2 mm. had one surface polished with alumina and washed successively in boiling concentrated nitric acid, concentrated hydrochloric acid, isopropyl alcohol and then dried. A layer of gold 2$\mu$ in depth, was deposited on the polished surface of the silicon disc using normal vacuum techniques and the disc heated in a furnace under an atmosphere of nitrogen at a temperature of 500° C. for several hours. The time must be sufficient to ensure the formation of a molten gold/silicon alloy having a uniform concentration of silicon over the upper surface of the disc.

The disc was then moved to the cool zone of the furnace where it cooled rapidly to approximately 50° C., when silicon was recrystallised from the liquid alloy which solidified at the gold/silicon eutectic temperature to give an alloy layer on the surface of the silicon disc 1. It is believed that the rapid cooling ensured that the recrystallised silicon was distributed throughout the solidified alloy layer and not epitaxially deposited on the silicon substrate.

The silicon body having a thickness of 150$\mu$ and a diameter of 1 cm. requiring a gold diffusion process was chemically polished on the surface into which gold was to be diffused and the polished surface placed on the solid gold/silicon alloy layer. The two discs were then placed in a furnace in a horizontal position and heated to 450° C. in an inert atmosphere, the eutectic alloy melted at 375° C. and above this temperature the molten alloy dissolved the recrystallised silicon to form a molten gold/silicon alloy, on which floated the silicon body. The molten alloy was maintained at 450° C. for 72 hours and gold diffusion from the molten alloy into the floating silicon body. The whole was removed to the cold zone of the furnace after diffusion where they cooled to approximately 50° C. After cooling to room tempearture the body was removed from the solidified gold/silicon alloy layer.

In Table III is shown the results of surface resistivities obtained by diffusing gold into silicon bodies which are oxygen-rich and oxygen-free.

Two oxygen-rich n-type silicon bodies having an oxygen concentration of approximately $10^{18}$ cm.$^{-3}$ calculated from infra-red measurements at 9.1$\mu$ were prepared and one body (i) had gold diffused into one surface using the molten alloy method at 450° C. for 72 hours; the other oxygen-rich body (ii) was given an identical heat treatment in a furnace without any gold diffusion step; this was the control sample. The n-type oxygen-free body (iii) had been prepared by float zone refining and had an oxygen concentration of $<10^{17}$ cm.$^{-3}$; it was subjected to the same gold diffusion process as sample (i). After gold diffusion using the molten alloy method the three silicon bodies were heated at 1000° C. for respectively 82, 82 and 72 hours.

The surface resistivities ($\rho$) were measured on the original bodies and after each heat treatment.

TABLE III

| | Original $\rho$ (ohm-cm.) | After molten alloy treatment ($\rho$) | After 1,000° C. treatment ($\rho$) |
|---|---|---|---|
| (i) | 17 | 2.4 | [1] ~2,000 |
| (ii) | 17 | 1.6 | [1] 39 |
| (iii) | 60 | 73 | [1] 100 |

[1] 82 hours.

It is seen from Table III that the silicon body (i) shows a larger increase in acceptor concentration than the control silicon body (ii) and the oxygen-free silicon body (iii). The gold introduced into silicon at 450° C. has no appreciable effect with sample (iii) indicating that the change in resistivity in samples (i) and (ii) is due to $SiO_4$ complexing. The increase in resistivity in sample (ii) was probably due to oxygen precipitation and infra-red measurements showed that the oxygen concentration decreased from approximately $10^{18}$ cm.$^{-3}$ in the original sample to $2.2\times10^{17}$ cm.$^{-3}$ after heat treatment at 1000° C. Sample (i) gave the same value of surface resistivity when 10$\mu$ was etched from the surface.

I claim:

1. A semiconductor device comprising a silicon body containing a region of oxygen-rich silicon, said oxygen-rich region also containing added gold atoms in a concentration at least partly compensating the effect of the oxygen present.

2. A semiconductor device comprising a silicon body containing a region of oxygen-rich silicon, said oxygen content lying between about $2\times10^{17}$ atom/cm.$^3$ and $1.8\times10^{18}$ atom/cm.$^3$, said oxygen-rich region also containing added gold atoms in a concentration at least partly compensating the effect of the oxygen present, said gold being present in a concentration which modifies the resistivity of the oxygen-rich silicon to a significantly greater extent than the same concentration would modify a comparable oxygen-free silicon region, said gold concentration being less than that which would modify the resistivity of a comparable oxygen-free silicon region.

3. A semiconductor device as set forth in claim 2 wherein the body contains a layer of silicon dioxide on one surface, said oxygen-rich region extending underneath the silicon dioxide layer.

4. A semiconductor device as set forth in claim 3 wherein the body contains a p-n junction which extends to the said one surface containing the layer of silicon dioxide.

5. A MOS semiconductor device comprising a silicon monocrystalline body of high resistivity, two spaced low resistivity surface regions in the body forming two p-n junctions extending to a common surface of the body, an insulating layer comprising silicon dioxide on the common surface between the spaced surface regions, a conductive layer on the insulating layer, said body containing beneath the insulating layer a region of oxygen-rich silicon, said oxygen content lying between about $2 \times 10^{17}$ atom/cm.$^3$ and $1.8 \times 10^{18}$ atom/cm.$^3$, said oxygen-rich region also containing added gold atoms in a concentration at least partly compensating the effect of the oxygen present, said gold being present in a concentration which modifies the resistivity of the oxygen-rich silicon to a significantly greater extent than the same concentration would modify the resistivity of a comparable oxygen-free silicon region, said gold concentration being less than that which would modify the resistivity of a comparable oxygen-free silicon region.

6. A MOS semiconductor device comprising a silicon monocrystalline body having a high resistivity surface portion, two spaced low resistivity surface regions in the high resistivity portion forming two p-n junctions extending to a common surface of the body, an insulating layer comprising silicon dioxide on at least the common surface between the spaced surface regions, a conductive layer on the insulating layer, said body comprising beneath the silicon dioxide oxygen-rich silicon, said oxygen-rich silicon region beneath the insulating layer in at least the underlying high resistivity surface portion containing added gold atoms in a concentration stabilizing its surface properties, and ohmic connections to the spaced surface regions.

References Cited

UNITED STATES PATENTS

| | | | |
|---|---|---|---|
| 3,204,160 | 8/1965 | Sah | 317—235 |
| 3,177,100 | 4/1965 | Mayen | 148—175 |

JOHN W. HUCKERT, *Primary Examiner.*

M. EDLOW, *Assistant Examiner.*

U.S. Cl. X.R.

148—1.5; 317—234